(12) United States Patent
Moon et al.

(10) Patent No.: US 10,790,447 B2
(45) Date of Patent: Sep. 29, 2020

(54) MASK FOR THIN FILM DEPOSITION, METHOD OF MANUFACTURING THE SAME, AND METHOD OF MANUFACTURING A DISPLAY APPARATUS USING THE SAME

(71) Applicant: Samsung Display Co., Ltd., Yongin-si (KR)

(72) Inventors: Youngmin Moon, Yongin-si (KR); Sungsoon Im, Yongin-si (KR); Jeongkuk Kim, Yongin-si (KR); Minho Moon, Yongin-si (KR); Kyuhwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/865,141

(22) Filed: Jan. 8, 2018

(65) Prior Publication Data

US 2019/0027687 A1 Jan. 24, 2019

(30) Foreign Application Priority Data

Jul. 20, 2017 (KR) .......................... 10-2017-0092257

(51) Int. Cl.
*H01L 51/00* (2006.01)
*H01L 27/32* (2006.01)
(Continued)

(52) U.S. Cl.
CPC .......... *H01L 51/0011* (2013.01); *B23K 26/50* (2015.10); *C23C 14/042* (2013.01);
(Continued)

(58) Field of Classification Search
None
See application file for complete search history.

(56) References Cited

U.S. PATENT DOCUMENTS 5,336,964 A * 8/1994 Capek .................. H01J 29/073
313/402
5,414,514 A * 5/1995 Smith .................. G03F 9/7049
250/548

(Continued)

FOREIGN PATENT DOCUMENTS

JP 2006-278008 10/2006
JP 2010-155344 7/2010

(Continued)

*Primary Examiner* — Zandra V Smith
*Assistant Examiner* — Lawrence C Tynes, Jr.
(74) *Attorney, Agent, or Firm* — H.C. Park & Associates, PLC

(57) ABSTRACT

A mask for thin film deposition of a display apparatus having both end portions coupleable to a frame in a state of tension in a lengthwise direction thereof, the mask including: a first portion having a first thickness and a plurality of pattern holes through which a deposition material may pass; a second portion comprising a welding portion having a second thickness configured to be coupled to a frame; and a third portion connecting the first portion and the third portion, wherein the first thickness is less than the second thickness, and the third portion includes an inclined surface connecting the first portion and the second portion.

7 Claims, 7 Drawing Sheets

(51) Int. Cl.
| | |
|---|---|
| *H01L 51/56* | (2006.01) |
| *C25D 1/20* | (2006.01) |
| *C25D 1/10* | (2006.01) |
| *C23C 16/04* | (2006.01) |
| *C23C 4/04* | (2006.01) |
| *B23K 26/50* | (2014.01) |
| *G03F 7/20* | (2006.01) |
| *C23C 14/04* | (2006.01) |
| *G03F 7/16* | (2006.01) |
| *G03F 7/26* | (2006.01) |
| *C25D 1/08* | (2006.01) |
| *C23C 14/12* | (2006.01) |
| *G03F 7/12* | (2006.01) |

(52) U.S. Cl.
CPC ............ *C23C 14/12* (2013.01); *C23C 16/042* (2013.01); *C25D 1/08* (2013.01); *C25D 1/10* (2013.01); *C25D 1/20* (2013.01); *G03F 7/16* (2013.01); *G03F 7/2002* (2013.01); *G03F 7/2006* (2013.01); *G03F 7/26* (2013.01); *H01L 27/3244* (2013.01); *H01L 51/001* (2013.01); *H01L 51/56* (2013.01); *G03F 7/12* (2013.01)

(56) References Cited

U.S. PATENT DOCUMENTS

| | | | | |
|---|---|---|---|---|
| 5,808,742 | A * | 9/1998 | Everett | G03F 9/70 |
| | | | | 356/401 |
| 5,868,952 | A * | 2/1999 | Hatakeyama | G03F 7/001 |
| | | | | 216/45 |
| 9,666,837 | B2 | 5/2017 | Lee | |
| 2007/0018265 | A1* | 1/2007 | Koeda | B82Y 30/00 |
| | | | | 257/435 |
| 2008/0088568 | A1 | 4/2008 | Haga et al. | |
| 2009/0197295 | A1* | 8/2009 | Fournier | H01J 49/0004 |
| | | | | 435/29 |
| 2009/0244676 | A1* | 10/2009 | Uchiyama | G02B 26/101 |
| | | | | 359/225.1 |
| 2010/0079742 | A1* | 4/2010 | Kato | G03B 27/58 |
| | | | | 355/72 |
| 2013/0071775 | A1* | 3/2013 | Prushinskiy | C23F 1/02 |
| | | | | 430/5 |
| 2015/0283651 | A1* | 10/2015 | Kudo | B23K 26/0869 |
| | | | | 264/400 |
| 2016/0047030 | A1* | 2/2016 | Obata | C23C 14/048 |
| | | | | 438/99 |
| 2016/0322571 | A1* | 11/2016 | Lee | H01L 51/56 |
| 2016/0333457 | A1* | 11/2016 | Ma | C23C 14/042 |

FOREIGN PATENT DOCUMENTS

| | | |
|---|---|---|
| JP | 2014-191922 | 10/2014 |
| KR | 10-2005-0083421 | 8/2005 |
| KR | 10-2010-0022438 | 3/2010 |
| KR | 10-2015-0006255 | 1/2015 |
| KR | 10-2016-0128529 | 11/2016 |

* cited by examiner

MASK FOR THIN FILM DEPOSITION, METHOD OF MANUFACTURING THE SAME, AND METHOD OF MANUFACTURING A DISPLAY APPARATUS USING THE SAME

CROSS-REFERENCE TO RELATED APPLICATION

This application claims priority from and the benefit of Korean Patent Application No. 10-2017-0092257, filed on Jul. 20, 2017, which is hereby incorporated by reference for all purposes as if fully set forth herein.

BACKGROUND

Field

Exemplary implementations of the invention relate generally to masks for thin film deposition, methods of manufacturing the same, and methods of manufacturing a display apparatus using the same, and, more particularly, to masks able to provide higher resolution displays that can reduce problems during manufacture such as shadow effects.

Discussion of the Background

In general, flat panel organic light-emitting display apparatus has drawn attention not only as an active light-emitting display apparatus exhibiting a wide viewing angle and excellent contrast, but also as a next-generation display apparatus exhibiting low-voltage operation, a light and thin shape, and a high response speed.

Light-emitting devices are classified into inorganic light-emitting devices and organic light-emitting devices depending on the material used for forming the light-emitting layer. Recently, the organic light-emitting device has been actively developed due to its advantages of superior brightness and response speed, and its general capability as a color display, compared to an inorganic light-emitting device.

In the organic light-emitting display apparatus, an organic film and/or an electrode are formed by a vacuum deposition method. However, as the resolution of an organic light-emitting display apparatus gradually increases, the width of an open slit of a mask used in a deposition process gradually decreases, and the distribution of pattern holes of open slits also needs to be gradually decreased.

Shadow effects should be reduced or eliminated in order to manufacture a high-resolution, organic light-emitting display apparatus. Accordingly, the display substrate and mask need to be in close proximity to each other during the deposition process to create a high resolution display.

The above information disclosed in this Background section is only for enhancement of understanding of the background of the inventive concepts, and, therefore, it may contain information that does not form constitute prior art.

SUMMARY

In general, as the thickness of a mask for thin film deposition decreases, the welding strength during welding of the mask for thin film deposition and its frame decreases, and thus the mask for thin film deposition is highly likely to be damaged when used or replaced. Furthermore, during the welding of the mask for thin film deposition and the frame, a tensile force is applied to the mask for thin film deposition. In this case, the mask for thin film deposition is highly likely to be deformed due to low strength of the mask for thin film deposition having a thin thickness.

Even when the thickness of a welding portion is formed to be thicker than a pattern portion to address the above issue, and when a magnetic plate is used to create coherence between a display substrate and the mask for thin film deposition, due to the sharp difference in thickness between the welding portion and the pattern portion, a repulsive force is generated between the mask for thin film deposition and the substrate, and thus a space is formed between the mask for thin film deposition and the substrate. Accordingly, a shadow phenomenon occurs.

Applicant recognized that there is a need to enhance coherence between the display substrate and the mask used to produce high resolution display without excessive shadow effects or similar defects.

Exemplary implementations of the invention provide a mask for thin film deposition that may improve the strength of the weld between the mask and the frame, and the ability of the mask for thin film deposition and the display substrate to be maintained in abutting relationship to each other without gaps (hereinafter referred to as "coherence"), a method of manufacturing the mask, and a method of manufacturing a display apparatus using the mask.

Additional aspects will be set forth in the detailed description which follows, and, in part, will be apparent from the disclosure, or may be learned by practice of the inventive concepts.

Exemplary implementations include a mask for thin film deposition of a display apparatus having both end portions coupleable to a frame in a state of tension in a lengthwise direction thereof, the mask including: a first portion having a first thickness and a plurality of pattern holes through which a deposition material may pass; a second portion comprising a welding portion having a second thickness configured to be coupled to a frame; and a third portion connecting the first portion and the third portion, wherein the first thickness is less than the second thickness, and the third portion includes an inclined surface connecting the first portion and the second portion.

An inclined surface may have an inclination angle greater than or equal to about 0.025° and less than or equal to about 10°.

The inclination angle of the inclined surface may be greater than or equal to about 0.045° and less than or equal to about 10°.

The first portion is a pattern portion, the second portion is a welding portion, and the third portion is a connection portion, which together comprise a first plating layer, and the welding portion and the connection portion comprise a second plating layer distinct from the first plating layer.

The second plating layer may be disposed on the first plating layer.

The inclined surface may be disposed on the second plating layer of the connection portion.

Exemplary implementations also include a method of manufacturing a mask for thin film deposition of a display apparatus by electroforming, the method including the steps of: plating a first layer on an electrode plate, the first layer including a first substantially flat portion, a second substantially flat portion, and a third connecting portion disposed between and connecting the first and second portions; disposing a member comprising non-conductive material having a first inclined surface against the first portion such that the first inclined surface is spaced apart from the second and third portions of the first layer; and plating a second layer, having a second inclined surface configured to mate against the first inclined surface, on the second portion and on the third portion without contacting the first portion, thus forming a raised area in the second portion configured for welding and an inclined section in the third connecting portion, with the thickness of the first portion being less than the thickness of the raised area.

The first inclined surface may have an inclination angle of greater than or equal to about 0.025° and less than or equal to about 10°.

The inclination angle may be greater than or equal to about 0.045° and less than or equal to about 10°.

The method may further include the step of separating the electrode plate from the first layer and separating the member from the first layer and the second layer after the step of the plating of the second layer on the second and third portions.

The method may further include the step of forming a plurality of pattern holes, through which a deposition material can pass, by irradiating a laser beam onto the first portion, after the separating of the electrode plate from the first layer and separating the member from the first layer and the second layer, wherein the first portion includes a pattern portion.

The method may further include, after separating the electrode plate from the first layer and separating the member from the first layer and the second layer, the steps of: coating a photoresist layer on the pattern portion, the raised area, and third portion; exposing the photoresist layer to light; exposing, to outside, an etching area obtained by developing the photoresist layer and arranged in the pattern portion; and forming a plurality of pattern holes, through which a deposition material can pass, by performing wet etching on the etching area.

Exemplary implementations also include a method of manufacturing a display apparatus from a mask for thin film deposition having both end portions coupled to a frame in a state of tension in a lengthwise direction thereof, the method including the steps of: inserting a display substrate and a mask for thin film deposition into a chamber, the mask having a pattern portion in which a plurality of holes are formed, a welding portion coupled to the frame, and a connection portion having an inclined surface disposed between the pattern portion and the welding portion, wherein the pattern portion has a thickness less than the thickness of the welding portion; and forming a film using a deposition material on the display substrate by conducting the deposition material sprayed from a deposition source through the holes in the mask for thin film deposition.

The inclined surface may have an inclination angle of greater than or equal to about 0.025° and less than or equal to about 10°.

The inclination angle of the inclined surface may be greater than or equal to about 0.045° and less than or equal to about 10°.

The pattern portion, the welding portion, and the connection portion may include a first plating layer formed through a first electroforming step, and the welding portion and the connection portion include a second plating layer formed through a second electroforming step distinct from the first electroforming step.

The second plating layer may be formed on the first plating layer.

The inclined surface may be formed on the second plating layer of the connection portion.

The plurality of holes may be formed by etching part of the pattern portion by irradiating a laser beam onto the pattern portion.

The plurality of holes may be formed by etching part of the pattern portion through wet etching.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
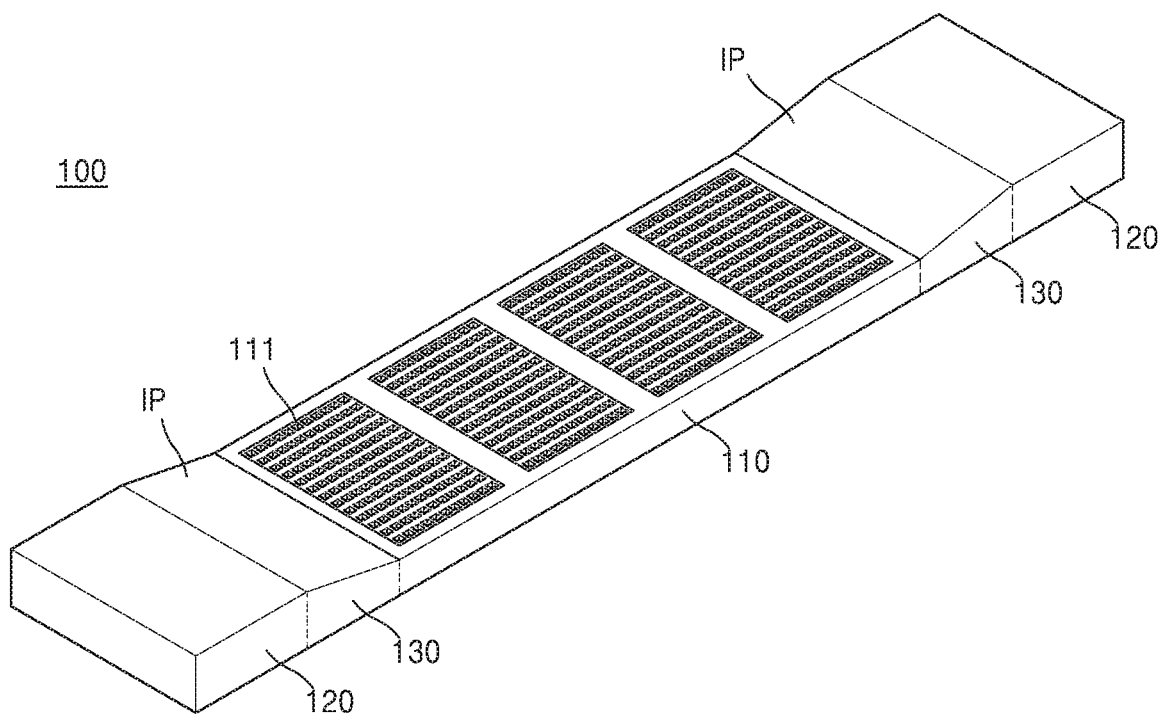
FIG. 1 is a perspective view of a mask for thin film deposition according to an exemplary embodiment of the invention.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, andz-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
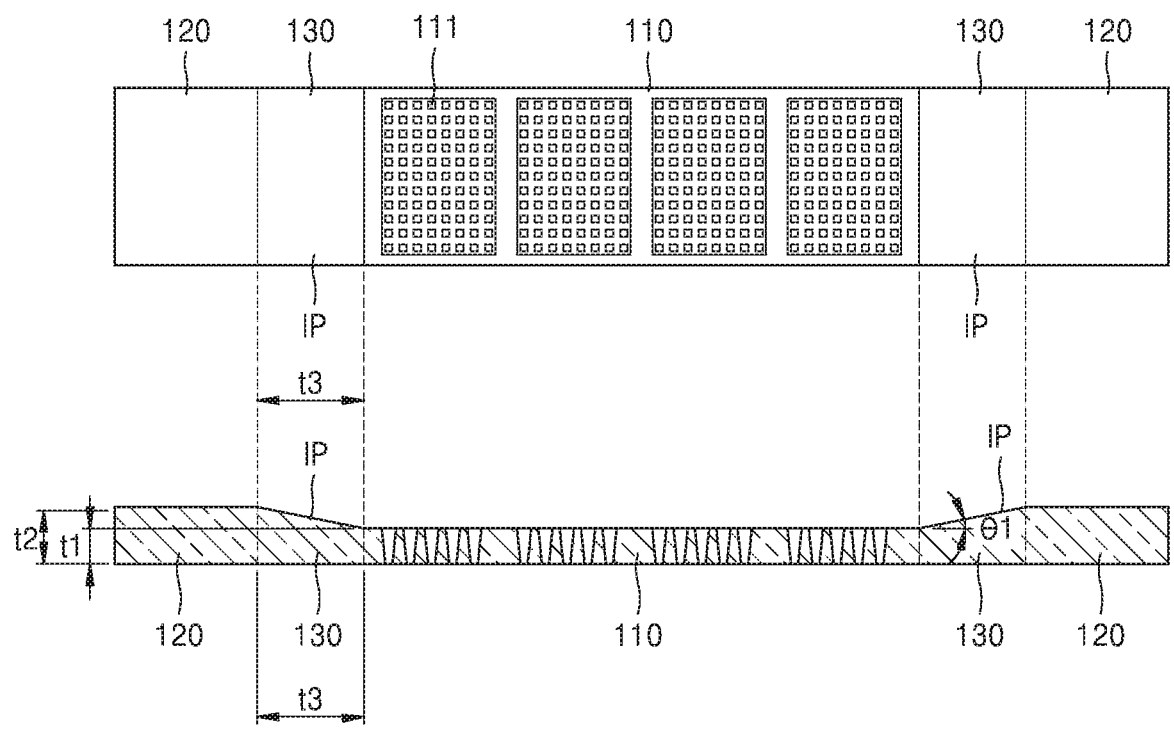
FIG. 2 is a front view and a side view of the mask for thin film deposition of FIG. 1, respectively viewed from the front side and the lateral side.

FIG. 1 is a perspective view of a mask 100 for thin film deposition according to an exemplary embodiment of the invention. FIG. 2 is a front view and a side view of the mask 100 for thin film deposition of FIG. 1, respectively viewed from the front side and the lateral side.

Referring to FIGS. 1 and 2, the mask 100 for thin film deposition according to an exemplary embodiment may include a pattern portion 110, a welding portion 120, and a connection portion 130.

The mask 100 for thin film deposition may be formed of a thin magnetic film, particularly, an invar alloy (known generically as FeNi36 (64FeNi in the US). The mask 100 for thin film deposition illustrated in FIGS. 1 and 2 may have a generally stick shaped configuration, and may be arranged in a plural and substantially parallel form on a frame 140 (see FIG. 9) in a widthwise direction of the mask 100 for thin film deposition. Both end portions of the mask 100 for thin film deposition, which are tensioned in the lengthwise direction thereof, may be coupled to the frame 140.

In detail, the pattern portion 110 may include a plurality of pattern holes 111 for passing a deposition material in a certain pattern. The welding portions 120 are provided at both end portions of the mask 100 for thin film deposition for coupling the mask 100 for thin film deposition to the frame.

In general, in order to implement a high-resolution display, density of the pattern holes 111 is increased. To this end, the mask 100 for thin film deposition has a thin thickness.

However, when the thickness of the welding portion 120 is substantially the same as the thickness of the pattern portion 110 (not illustrated in the drawings), as the thickness of the mask 100 for thin film deposition decreases during welding of the mask 100 and the frame 140, the welding strength decreases, and thus the mask 100 may be easily damaged. Accordingly, to implement a high-resolution display, the pattern portion 110 where the pattern holes 111 are disposed is formed as thin as possible, and the welding portion 120 that is welded to the frame 140 is formed to be thicker than the pattern portion 110, thereby increasing the welding strength of the mask 100 for thin film deposition with respect to the frame 140. Thus, the mask 100 for thin film deposition may be prevented from being easily separated from the frame 140.

However, as described above, when the pattern portion 110 and the welding portion 120 are formed to have different thicknesses, a sharp difference in thickness occurs at an outer surface between the pattern portion 110 and the welding portion 120. When the above structure is used in a deposition process, and a magnetic force is applied to the mask 100 for thin film deposition to allow the mask 100 and a display substrate 21 (see FIG. 9) to cohere to each other (meaning to "maintain an abutting relationship without gaps" due to a force, such as magnetic, generated by a substrate support portion 14 of FIG. 9 which is described later), a problem may occur in which a repulsive force to the display substrate 21 is generated at the boundary surface between the pattern portion 110 and the welding portion 120.

In other words, when the welding portion 120 is formed to be thicker than the pattern portion 110, it is advantageous in coupling the welding portion 120 to the frame 140. However, at the same time, a thicker welding portion is disadvantageous because it does not promote coherence between the display substrate 21 and the mask 100 in a deposition process. Rather, due to the repulsive force to the display substrate 21 generated at the boundary surface between the pattern portion 110 and the welding portion 120, a phenomenon occurs in which the mask 100 for thin film deposition may be spaced apart from the display substrate 21. Accordingly, due to the gap between the mask 100 for thin film deposition and the display substrate 21, a shadow phenomenon may occur in which the deposition material passing through the pattern holes 111 does not accurately form a film in a desired area of the display substrate 21.

To reduce or solve the above-described problems, the mask 100 for thin film deposition according to the exemplary embodiment illustrated in FIGS. 1 and 2, may connect the pattern portion 110 and the welding portion 120, and may include the connection portion 130 having an inclined plane IP connecting the pattern portion 110 and the welding portion 120.

In detail, the pattern portion 110 may have a first thickness t1 and the welding portion 120 may have a second thickness t2 thicker than the first thickness t1. Since the connection portion 130 may include the inclined plane IP that connects the pattern portion 110 having the first thickness t1 and the welding portion 120 having the second thickness t2 thicker than the first thickness t1, the pattern portion 110 and the welding portion 120 may be connected to each other without having a sharp thickness change therebetween. In detail, when a length t3 of the connection portion 130 is designed to be about 20 mm, to implement a high-resolution display, a height difference between the pattern portion 110 and the welding portion 120, that is, a difference (t2−t1) between the second thickness t2 and the first thickness t1, may be designed to be about 15 According to the above structure, in the connection portion 130, an inclination angle θ1 of the inclined plane IP may be about 0.045°, but the present disclosure are not limited thereto.

For example, when the difference (t2−t1) between the second thickness t2 and the first thickness t1 is designed to be about 10 the inclination angle θ1 of the inclined plane IP may be about 0.025°. In other words, the inclination angle θ1 of the inclined plane IP may be determined by how the difference in thickness (t2−t1) between the pattern portion 110 and the welding portion 120 and the length t3 of the connection portion 130 are set during the design of the mask 100 for thin film deposition. However, in the following description, a case in which the thickness difference (t2−t1) between the pattern portion 110 and the welding portion 120 is designed to be about 15 μm and the length t3 of the connection portion 130 is designed to be about 20 mm, and thus the inclination angle θ1 of the inclined plane IP is about 0.045°, is mainly discussed.

In other words, if the pattern portion 110 and the welding portion 120 are connected to each other by the connection portion 130 having the inclined plane IP, a shadow phenomenon that may be generated due to the sharp thickness change between the pattern portion 110 and the welding portion 120 may be reduced or prevented.

Furthermore, in a process of welding the mask 100 to the frame 140 in a state in which the mask 100 is tensioned as both end portions of the mask 100 for thin film deposition are clamped by using a clamp (not shown), the connection portion 130 may buffer a tension force applied to the mask 100 for thin film deposition. Accordingly, the pattern portion 110 may be prevented from being deformed by the tension force applied to the mask 100 for thin film deposition, and consequently, the deformation of the pattern holes 111 may be prevented so that a deposition material may be deposited in a high accuracy pattern at a target location on the display substrate 21.

In detail, the pattern portion 110, the welding portion 120, and the connection portion 130 may be formed through electroforming. Although described below, the pattern portion 110, the welding portion 120, and the connection portion 130 may include a first plating layer PL_1 (see FIG. 8) formed through a first electroforming step. The welding portion 120 and the connection portion 130 may include a second plating layer PL_2 formed through a second electroforming step. Although the first plating layer PL_1 and the second plating layer PL_2 may be formed of the same material, exemplary embodiments of the inventive concepts are not limited thereto. For example, although the first plating layer PL_1 and the second plating layer PL_2 may be formed of different materials, in the following description, a case in which the first plating layer PL_1 and the second plating layer PL_2 are both formed of an invar alloy, is mainly discussed.

A method of manufacturing the mask 100 for thin film deposition according to an exemplary embodiment is described below with reference to FIGS. 3 to 8.

FIGS. 3, 4, 5, 6, 7, and 8 are conceptual diagrams sequentially illustrating the steps in a method of manufacturing a mask for thin film deposition according to another exemplary embodiment of the invention.

Figure 3:
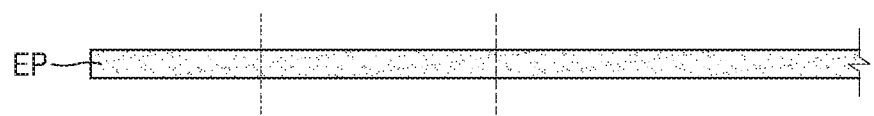
FIGS. 3, 4, 5, 6, 7, and 8 are conceptual diagrams sequentially illustrating the steps in a method of manufacturing a mask for thin film deposition according to another exemplary embodiment of the invention.

First, as illustrated in FIG. 3, an electrode plate EP is prepared. The electrode plate EP may be formed of suitable metal, such as a type of stainless steel (SUS).

Figure 4:
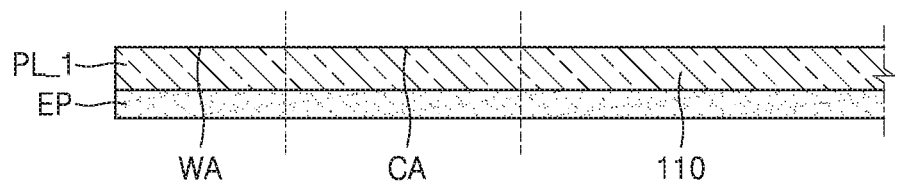

Referring to FIG. 4, the first plating layer PL_1 is plated on the electrode plate EP. The first plating layer PL_1 may be plated on the electrode plate EP through electroforming, and may include a welding area WA, where the welding portion 120 is to be formed, and a connection area CA where the connection portion 130 may be to be formed.

Figure 5:
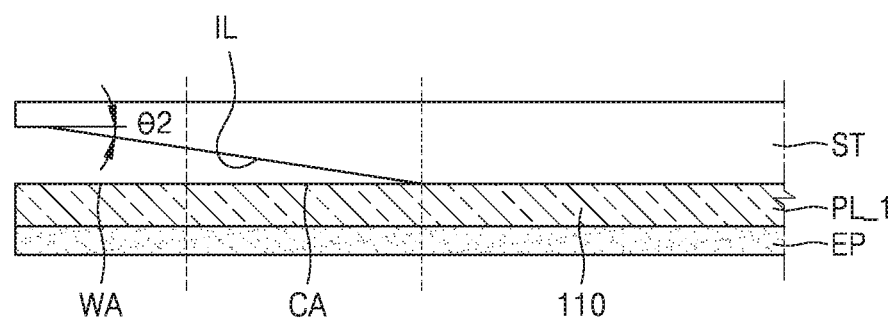

Next, referring to FIG. 5, a structure ST is contacted with the pattern portion 110 of the first plating layer PL_1. The structure ST may include a non-conductor that is not conductive. Accordingly, the second plating layer PL_2, which is described below, may be plated only on the first plating layer PL_1. In this manner, the structure ST may provide a boundary surface providing a stop defining the position at which the second plating layer PL_2 is plated on the first plating layer PL_1.

In detail, the structure ST may be arranged to contact the entire surface of the pattern portion 110 of the first plating layer PL_1. The structure ST may include an inclined surface IL that is spaced apart a certain distance from the welding area WA and the connection area CA of the first plating layer PL_1. According to the structure, the second plating layer PL_2 plated on the connection area CA may have a shape corresponding to the inclined surface IL of the structure ST.

An inclination angle θ2 of the inclined surface IL may be greater than or equal to about 0.025° and less than or equal to about 10°, more specifically, greater than or equal to about 0.045° and less than or equal to about 10°. If the inclination angle θ2 of the inclined surface IL is less than about 0.025°, the expected effect of the mask 100 for thin film deposition according to the illustrated embodiment, in which the pattern portion 110 and the welding portion 120 are substantially connected to each other through the connection portion 130 having the inclined surface IL, may not be obtained. In other words, when the inclination angle θ2 of the inclined surface IL is less than about 0.025°, the inclination angle θ1 of the inclined surface IP (see FIG. 2) of the connection portion 130 is also formed to be less than about 0.025°. Such a structure in which the pattern portion 110 and the welding portion 120 are connected to each other substantially without the connection portion 130, provides a minimal thickness difference between the pattern portion 110 and the welding portion 120. In other words, when the inclination angle θ2 of the inclined surface IL of the structure ST is less than about 0.025°, the expected effects according to the inventive concepts in may not be obtained.

Similarly, when the inclination angle θ2 of the inclined surface IL exceeds about 10°, the effect obtained by connecting the pattern portion 110 and the welding portion 120 by the connection portion 130 having the inclined plane IP may not be expected. In other words, when the inclination angle θ2 of the inclined surface IL exceeds about 10°, the repulsive force generated due to the difference in thickness between the pattern portion 110 and the welding portion 120 may not be prevented.

Figure 6:
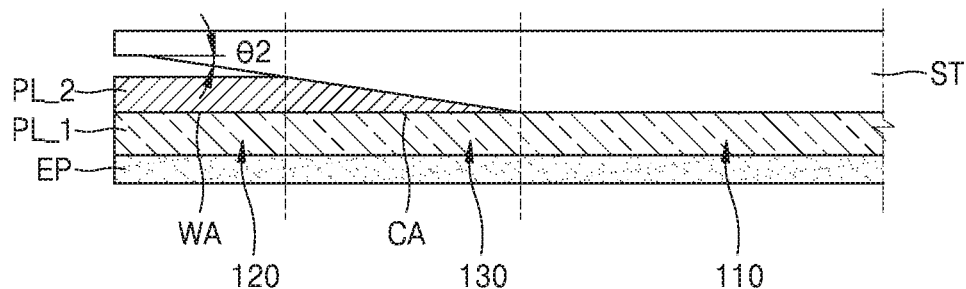

Next, referring to FIG. 6, by plating the second plating layer PL_2 on the welding area WA and the connection area CA of the first plating layer PL_1, and not the pattern portion 110 contacting the structure ST, the welding portion 120 may be formed in the welding area WA and the connection portion 130 may be formed in the connection area CA. The second plating layer PL_2 may be also plated on the first plating layer PL_1 through electroforming.

In detail, as illustrated in FIG. 6, the second plating layer PL_2 may be plated in a space defined between the structure ST and the first plating layer PL_1. In this case, the inclined surface IP (see FIG. 1) provided on the connection portion 130 of the mask 100 for thin film deposition may be formed later on the second plating layer PL_2 plated on the connection area CA, after the structure ST and the electrode plate EP are separated.

Figure 7:
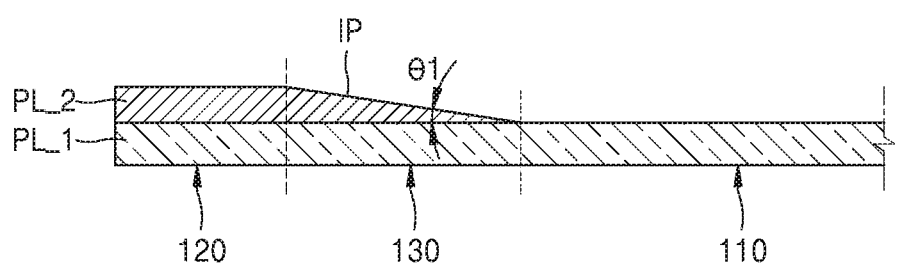

FIG. 7 illustrates the resulting structure 100m, after the first plating layer PL_1 and the second plating layer PL_2 are sequentially plated, the electrode plate EP is separated from the first plating layer PL_1, and the structure ST is separated from the first plating layer PL_1 and the second plating layer PL_2, which thus forms a base member 100m of a mask for thin film deposition.

Figure 8:
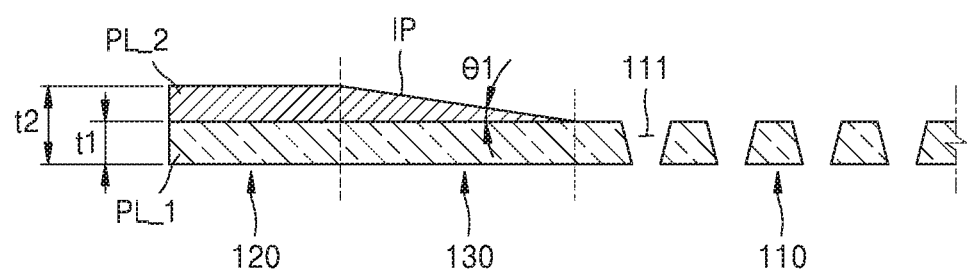

FIG. 8 illustrates that mask after the pattern holes 111 are form in the base member 100m. For example, after the base member 100m of the mask for thin film deposition is manufactured by separating the electrode plate EP from the first plating layer PL_1 and the structure ST from the first plating layer PL_1 and the second plating layer PL_2, a laser beam (not shown) may be irradiated on the pattern portion 110 to thus form the pattern holes 111, through which a deposition material passes.

In another embodiment, the pattern holes 111 may be formed by wet etching. In other words, after the base member 100m of the mask for thin film deposition is provided by separating the electrode plate EP from the first plating layer PL_1 and the structure ST from the first plating layer PL_1 and the second plating layer PL_2, a photoresist layer (not shown) may be coated on the pattern portion 110, the welding portion 120, and the connection portion 130, a photomask may be disposed on the pattern portion 110, part of the photoresist layer that is not covered with the photomask may be exposed to light, that is, an ultraviolet (UV) ray or a laser beam, the photoresist layer may be developed, and an etching area in the pattern portion 110 may be exposed to the outside. After sequentially passing through the above operations, the pattern holes 111, through which the deposition material passes, may be formed by wet etching the etching area.

In detail, the exposing and developing operations of the photoresist layer may be performed by a negative method or a positive method. For example, in the negative method, the exposed photoresist layer may remain after the developing process (part of the photoresist layer that is not exposed is removed). In contrast, in the positive method, the exposed photoresist layer may be removed by being developed or etched in the subsequent developing process (part of photoresist layer that is not exposed remains).

In other words, the etching area arranged in the pattern portion 110 may signify part of the photoresist layer that is removed in the exposing and developing operation of the photoresist layer, and part of the pattern portion 110 corresponding to the etching area may be exposed to the outside. Accordingly, the part of the pattern portion 110 located in the etching area may be processed by wet etching into the pattern holes 111.

Figure 9:
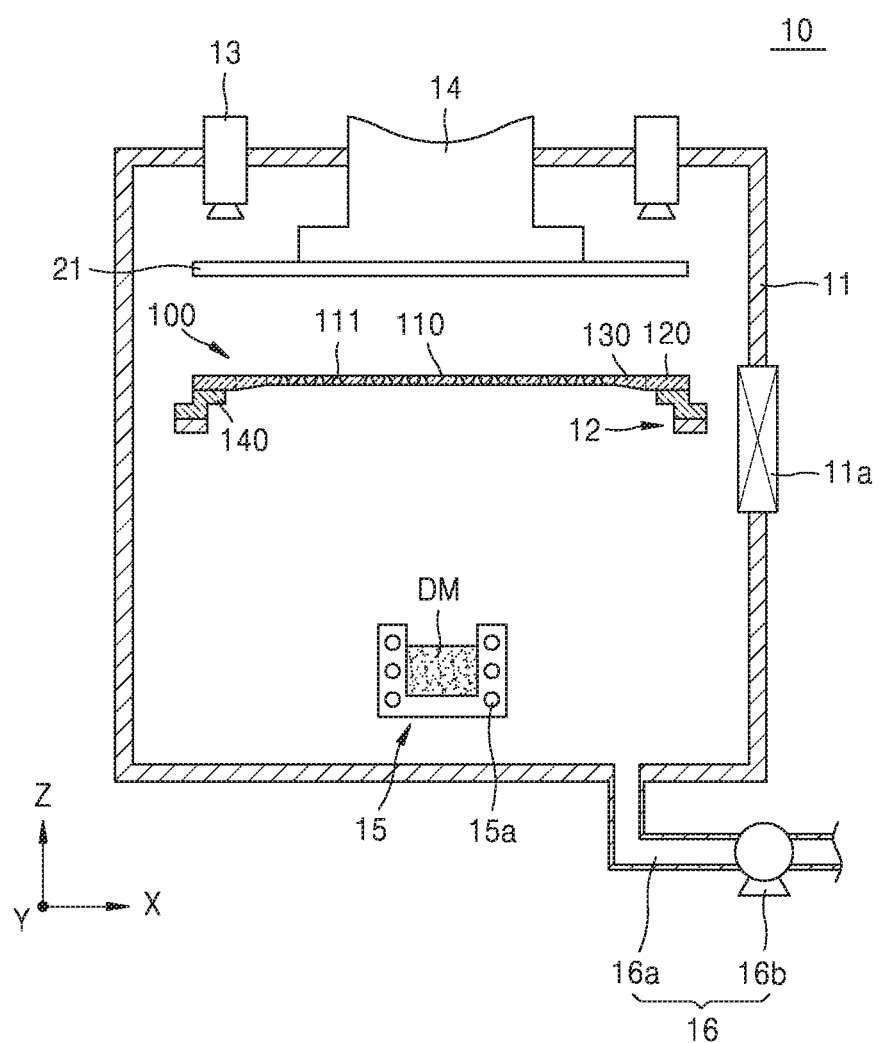
FIG. 9 is a conceptual diagram schematically illustrating a display apparatus manufacturing apparatus including the mask for thin film deposition of FIG. 1.

FIG. 9 is a conceptual diagram schematically illustrating a display apparatus manufacturing apparatus including the mask for thin film deposition of FIG. 1.

Referring to FIG. 9, a display apparatus manufacturing apparatus 10 may include a chamber 11, a mask assembly support portion 12, a vision portion 13, the substrate support portion 14, a deposition source 15, an intake portion 16, and the mask 100 for thin film deposition.

The mask 100 for thin film deposition may include, as described above, the pattern portion 110, the welding portion 120, and the connection portion 130, and the welding portion 120 may be coupled to the frame 140. Since the mask 100 for thin film deposition of FIG. 9 is the same as or similar to the mask 100 for thin film deposition described with reference to FIGS. 1 to 8, a detailed description thereof is omitted to avoid redundancy.

The chamber 11 may have an internal space and a part of the chamber 11 may be open. A gate valve 11a may be provided at the open part of the chamber 11 to selectively open or close the open part of the chamber 11.

The mask assembly support portion 12 may be arranged between the deposition source 15 and the mask 100 for thin film deposition. The frame 140 coupled to the mask 100 for thin film deposition may be placed and supported on the mask assembly support portion 12. Furthermore, the mask assembly support portion 12 may align the mask 100 for thin film deposition and the display substrate 21 by varying the displacement of the mask 100 for thin film deposition on an X-Y plane within a relatively small range.

Furthermore, although not illustrated in the drawings, the mask assembly support portion 12 may be moved in a Z-axis direction by being connected to a separate, conventional elevation driving portion. According to the above structure, the mask 100 for thin film deposition placed on the mask assembly support portion 12 may ascend toward the display substrate 21 or descend in a direction toward the deposition source 15.

The vision portion 13 may include a camera. The vision portion 13 may capture images of the locations of the display substrate 21 and the mask 100 for thin film deposition, and may provide necessary data for alignment of the display substrate 21 and the mask 100 for thin film deposition.

The substrate support portion 14 may support the display substrate 21. The substrate support portion 14 may support the display substrate 21 by various methods. For example, the substrate support portion 14 may include an electrostatic chuck, a plurality of permanent magnets having a certain magnetic force, or an electromagnet generating a magnetic force by using electric power supplied from the outside. Furthermore, the substrate support portion 14 may include a bracket, a clamp, etc. for supporting a part of the display substrate 21, as another embodiment. However, the exemplary embodiments are not limited thereto, and may include any apparatus capable of supporting the display substrate 21. However, in the following description, for convenience of explanation, the case in which the substrate support portion 14 includes an electrostatic chuck is mainly discussed in detail.

Furthermore, the substrate support portion 14 may be connected to a separate, conventional elevation driving portion to move support portion 14 in the Z-axis direction in the chamber 11. In other words, in a deposition process, the substrate support portion 14 may move the display substrate 21 toward the mask 100 such that a surface of the display substrate 21 contacts the mask 100. When the deposition process is stopped, the substrate support portion 14 may elevate upwardly in the chamber 11 in a direction away from the mask 100 for thin film deposition.

As described above, since the mask 100 for thin film deposition according to the illustrated embodiment includes the connection portion 130 having the inclined plane IP, when the mask 100 for thin film deposition is moved by the mask assembly support portion 12 to cohere to the display substrate 21, no gap between the mask 100 for thin film deposition and the display substrate 21 is formed, such as the one that is generated due to a sharp difference in thickness between the pattern portion 110 and the welding portion 120 of a mask without the connection portion 130 (not shown).

Accordingly, the mask 100 for thin film deposition and the display substrate 21 may maintained in a closely cohered state by magnetic forces, and when a deposition process is performed in this state, the shadow phenomenon occurring in the mask for thin film deposition that does not include the connection portion 130 may be remarkably reduced or prevented.

The deposition source 15 may include a deposition material. The deposition material may be a sublimable or vaporizable material, and may include at least one of an inorganic material, metal, and an organic material. However, in the following description, for convenience of explanation, a case in which a deposition material is an organic material is mainly discussed.

In detail, the deposition source 15 may be arranged to face the mask 100 for thin film deposition, and a part of the deposition source 15 arranged to face the mask 100 for thin film deposition may be formed to be open. Furthermore, the deposition source 15 may include a heater 15a that applies heat to the deposition material.

The intake portion 16 may be connected to the chamber 11 and may maintain the pressure in the chamber 11 constant. The intake portion 16 may include a connection pipe 16a connected to the chamber 11 and a pump 16b provided on the connection pipe 16a.

Figure 10:
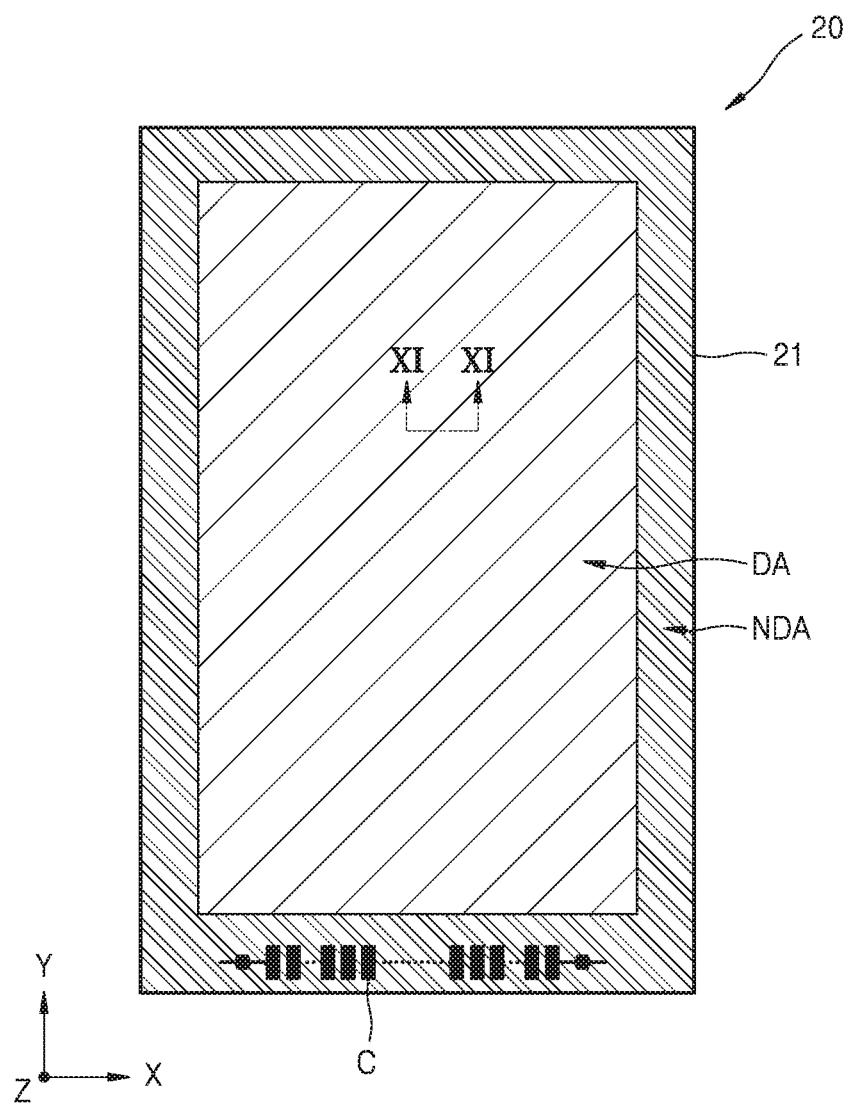
FIG. 10 is a plan view schematically illustrating a display apparatus manufactured through the display apparatus manufacturing apparatus of FIG. 9.
Figure 11:
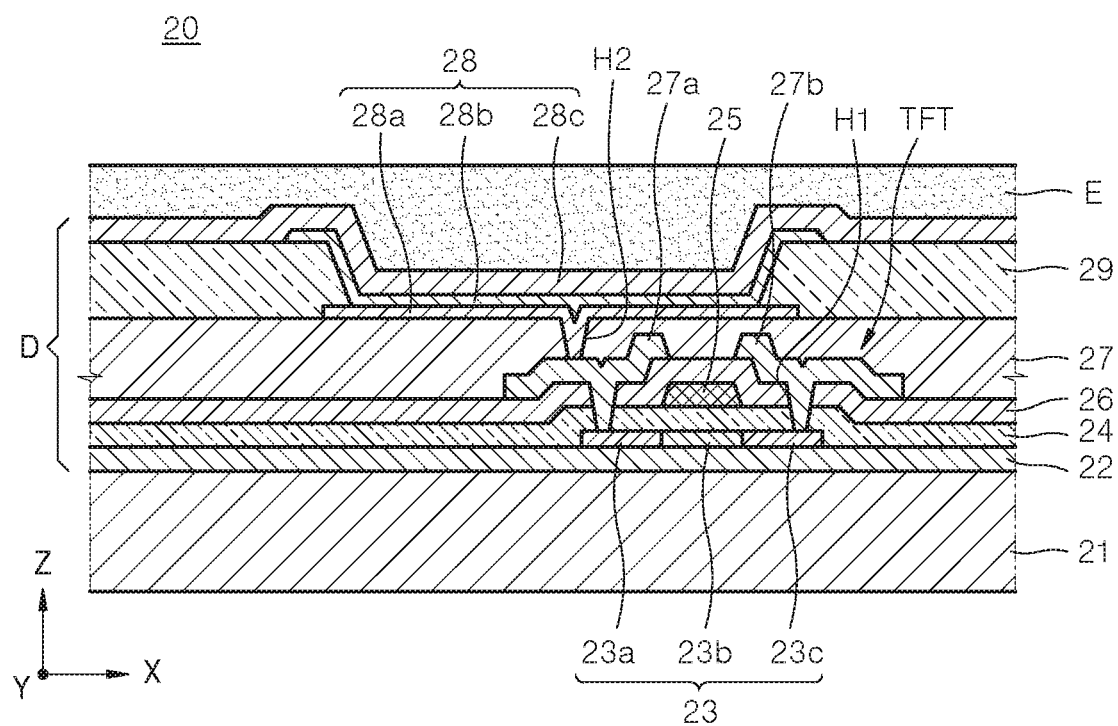
FIG. 11 is a cross-sectional view taken along line XI-XI of FIG. 10.

FIG. 10 is a plan view schematically illustrating a display apparatus 20 manufactured through the display apparatus manufacturing apparatus 10 of FIG. 9. FIG. 11 is a cross-sectional view taken along line XI-XI of FIG. 10.

Referring to FIGS. 10 and 11, the display apparatus 20 may include, on the display substrate 21, a display area DA and a non-display area NDA arranged outside the display area DA. A light-emitting portion D may be arranged in the display area DA, and a power wiring may be arranged in the non-display area NDA. Furthermore, a pad portion C may be arranged in the non-display area NDA.

The display apparatus 20 may include the display substrate 21 and the light-emitting portion D. Furthermore, the display apparatus 20 may include may include a thin film encapsulation layer E formed over the light-emitting portion D. The display substrate 21 may be formed of a glass material, but the exemplary embodiments are not limited thereto and a plastic material may be used or a metal material such as SUS or Ti may be used. Furthermore, the display substrate 21 may be formed of polyimide (PI).

The light-emitting portion D may be formed on the display substrate 21. The light-emitting portion D may be provided with a thin film transistor TFT, and a passivation film 27 may be formed to cover the thin film transistor TFT. An organic light-emitting device (OLED) 28 may be formed on the passivation film 27.

A buffer layer 22 formed of an organic compound and/or an inorganic compound may be further formed on an upper surface of the display substrate 21. The buffer layer 22 may be formed of SiOx (x≥1), SiNx (x≥1).

After an active layer 23 arranged in a certain pattern is formed on the buffer layer 22, the active layer 23 may be covered by a gate insulation layer 24. The active layer 23 has a source region 23a and a drain region 23c, and further includes a channel region 23b therebetween.

The active layer 23 may contain various materials. For example, the active layer 23 may contain an inorganic semiconductor material such as amorphous silicon or crystalline silicon. In another example, the active layer 23 may contain an oxide semiconductor. In another example, the active layer 23 may contain an organic semiconductor material. However, in the following description, for convenience of explanation, a case in which the active layer 23 is formed of amorphous silicon is mainly discussed in detail.

The active layer 23 may be formed by forming an amorphous silicon film on the buffer layer 22, crystallizing the amorphous silicon film into a polycrystal silicon film, and patterning the polycrystal silicon film. The source region 23a and the drain region 23c of the active layer 23 may be doped with impurities according to the type of TFT, for example, a driving TFT, a switching TFT, etc.

A gate electrode 25 corresponding to the active layer 23 and an interlayer insulation layer 26 which covers the gate electrode 25 may be formed on an upper surface of the gate insulation layer 24.

Next, after a contact hole H1 is formed in the interlayer insulation layer 26 and the gate insulation layer 24, a source electrode 27a and a drain electrode 27b may be formed on the interlayer insulation layer 26 to respectively contact the source region 23a and the drain region 23c.

The passivation film 27 may be formed over the TFT formed as described above, and a pixel electrode 28a of the OLED 28 may be formed over the passivation film 27. The pixel electrode 28a may contact a drain electrode 27b of the TFT through a via hole H2 formed in the passivation film 27. The passivation film 27 may be formed of an inorganic material and/or an organic material in a single layer, or in two or more layers. The passivation film 27 may be formed as a planarization film to have a flat upper surface regardless of unevenness of a lower film, or may be formed to be uneven according to the unevenness of a film located thereunder. The passivation film 27 may be formed as a transparent insulator to achieve a resonance effect.

After the pixel electrode 28a is formed on the passivation film 27, a pixel defining film 29 may be formed of an organic material and/or an inorganic material to cover the pixel electrode 28a and the passivation film 27, and is open to expose the pixel electrode 28a.

An intermediate layer 28b and an opposing electrode 28c may be formed at least on the pixel electrode 28a.

The pixel electrode 28a may function as an anode electrode, and the opposing electrode 28c may function as a cathode electrode. The polarities of the pixel electrode 28a and the opposing electrode 28c may be reversed.

The pixel electrode 28a and the opposing electrode 28c may be insulated from each other by the intermediate layer 28b. Light may be emitted from an organic emission layer (not shown) by applying voltages of different polarities to the pixel electrode 28a and the opposing electrode 28c.

The intermediate layer 28b may include the organic emission layer. In another embodiment, in addition to the organic emission layer, the intermediate layer 28b may further include a hole injection layer (HIL), a hole transport layer (HTL), an electron transport layer (ETL), and an electron injection layer (EIL). The illustrated exemplary embodiment is not limited thereto, and the intermediate layer 28b may further include various function layers in addition to the organic emission layer.

The intermediate layer 28b described above may be formed through the above-described display apparatus manufacturing apparatus 10.

A unit pixel may include a plurality of sub-pixels, and the sub-pixels may emit lights of various colors. For example, a plurality of sub-pixels may include sub-pixels emitting lights of red, green, and blue, or sub-pixels (not shown) emitting lights of red, green, blue, and white.

The above-described thin film encapsulation layer E may include a plurality of inorganic layers, or an inorganic layer and an organic layer.

The organic layer of the thin film encapsulation layer E may be formed of a polymer, or more specifically, a single layer or a stacked layer formed of any one of polyethylene terephthalate, polyimide, polycarbonate, epoxy, polyethylene, and polyacrylate. More particularly, the organic layer may be formed of polyacrylate, and in detail, may include a polymerized monomer composition comprising a diacrylate-based monomer and a triacrylate-based monomer. The monomer composition may further include a monoacrylate-based monomer. Furthermore, the monomer composition may further include a well-known photoinitiator such as TPO, but the present disclosure is not limited thereto.

The inorganic layer of the thin film encapsulation layer E may be a single film or a stacked film including a metal oxide or a metal nitride. In detail, the inorganic layer may include any one of SiNx, $Al_2O_3$, $SiO_2$, and $TiO_2$.

Of the thin film encapsulation layer E, an uppermost layer exposed to the outside may be formed of an inorganic layer to prevent intrusion of moisture into the OLED 28.

The thin film encapsulation layer E may include at least one sandwich structure in which at least one organic layer is inserted between at least two inorganic layers. In another example, the thin film encapsulation layer E may include at least one sandwich structure in which at least one inorganic layer is inserted between at least two organic layers. In another example, the thin film encapsulation layer E may include a sandwich structure in which at least one organic layer is inserted between at least two inorganic layers and a sandwich structure in which at least one inorganic layer is inserted between at least two organic layers.

The thin film encapsulation layer E may include a first inorganic layer, a first organic layer, and a second inorganic layer, sequentially and upwardly from an upper surface of the OLED 28.

In another example, the thin film encapsulation layer E may include a first inorganic layer, a first organic layer, a second inorganic layer, a second organic layer, and a third inorganic layer, sequentially and upwardly from an upper surface of the OLED 28.

In another example, the thin film encapsulation layer E may include a first inorganic layer, a first organic layer, a second inorganic layer, a second organic layer, a third inorganic layer, a third organic layer, and a fourth inorganic layer, sequentially and upwardly from an upper surface of the OLED 28.

A halogenated metal layer including LiF may be further included between the OLED 28 and the first inorganic layer. The halogenated metal layer may prevent damage of the OLED 28 when the first inorganic layer is formed in a sputtering method.

The first organic layer may have an area narrower than the second inorganic layer, and the second organic layer may have an area narrower than the third inorganic layer.

Accordingly, the display apparatus 20 may include the intermediate layer 28b forming an accurate pattern, and as the intermediate layer 28b is deposited at an accurate position, an accurate image may be implemented. Furthermore, the display apparatus 20 may form a constant pattern even when the intermediate layer 28b is repetitively deposited, and thus uniform quality may be obtained despite the continuous production of the display apparatus.

As described above, according to the above-described exemplary embodiments, a mask for thin film deposition having strength enough to prevent deformation or damage of the mask, including during welding of the mask and the frame, may be manufactured.

Furthermore, according to the exemplary embodiments, since the mask for thin film deposition and the display substrate closely cohere to each other, the deposition material may be deposited on the display substrate in a high accuracy pattern without gaps and resulting shadow phenomenon.

Furthermore, according to exemplary embodiments, a high-resolution display apparatus may be manufactured.

The above-described effects do not limit the scope of the inventive concepts.

It should be understood that exemplary embodiments described herein should be considered in a descriptive sense only and not for purposes of limitation. Descriptions of features or aspects within each embodiment should typically be considered as available for other similar features or aspects in other embodiments.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A method of manufacturing a display apparatus from a mask for thin film deposition having both end portions coupled to a frame in a state of tension in a lengthwise direction thereof, the method comprising the steps of:

inserting a display substrate and a mask for thin film deposition into a chamber, the mask having a pattern portion in which a plurality of holes are formed, a welding portion coupled to the frame, and a connection portion having an inclined surface disposed between the pattern portion and the welding portion, the inclined surface being connected to an edge portion of the pattern portion without being connected to peripheries of the holes, the inclined surface being defined by an acute inclination angle, wherein the pattern portion has a thickness less than the thickness of the welding portion; and forming a film using a deposition material on the display substrate by conducting the deposition material sprayed from a deposition source through the holes in the mask for thin film deposition, wherein the pattern portion, the welding portion, and the connection portion comprise a first plating layer formed through a first electroforming step, and the welding portion and the connection portion include a second plating layer formed through a second electroforming step distinct from the first electroforming step.

2. The method of claim 1, wherein the acute inclination angle is greater than or equal to about 0.025° and less than or equal to about 10°.

3. The method of claim 2, wherein the acute inclination angle is greater than or equal to about 0.045° and less than or equal to about 10°.

4. The method of claim 1, wherein the second plating layer is formed on the first plating layer.

5. The method of claim 1, wherein the inclined surface is formed on the second plating layer of the connection portion.

6. The method of claim 1, wherein the plurality of holes are formed by etching part of the pattern portion by irradiating a laser beam onto the pattern portion.

7. The method of claim 1, wherein the plurality of holes are formed by etching part of the pattern portion through wet etching.

* * * * *